United States Patent [19]

Addis

[11] Patent Number: 4,713,627

[45] Date of Patent: Dec. 15, 1987

[54] ACTIVE FILTER WITH BOOTSTRAPPING
[75] Inventor: John L. Addis, Beaverton, Oreg.
[73] Assignee: Tektronix, Inc., Beaverton, Oreg.
[21] Appl. No.: 917,626
[22] Filed: Oct. 10, 1986
[51] Int. Cl.[4] .......................... H03F 3/04; H03F 1/34
[52] U.S. Cl. .................................... 330/306; 330/294; 330/107
[58] Field of Search ................. 330/99, 107, 294, 303, 330/306; 307/520

[56] References Cited
U.S. PATENT DOCUMENTS
4,575,650  3/1986  Naimpally et al. ................. 330/294

Primary Examiner—Gene Wan
Attorney, Agent, or Firm—Mark L. Becker

[57] ABSTRACT

An active low-pass filter especially suitable for inclusion in an integrated circuit and capable of operating at frequencies up to at least $f_T/\beta$ of transistors within the filter. A bootstrap circuit is coupled to the emitter follower to reduce the capacitive effect of the emitter follower on the passed signal and to guarantee precision pass band gain match among the filters. A plurality of active filters may be connected across the signal path to provide a selection of bandwidths. A filter is switched into and out of the signal path by selectively enabling and disabling its current source.

10 Claims, 1 Drawing Figure

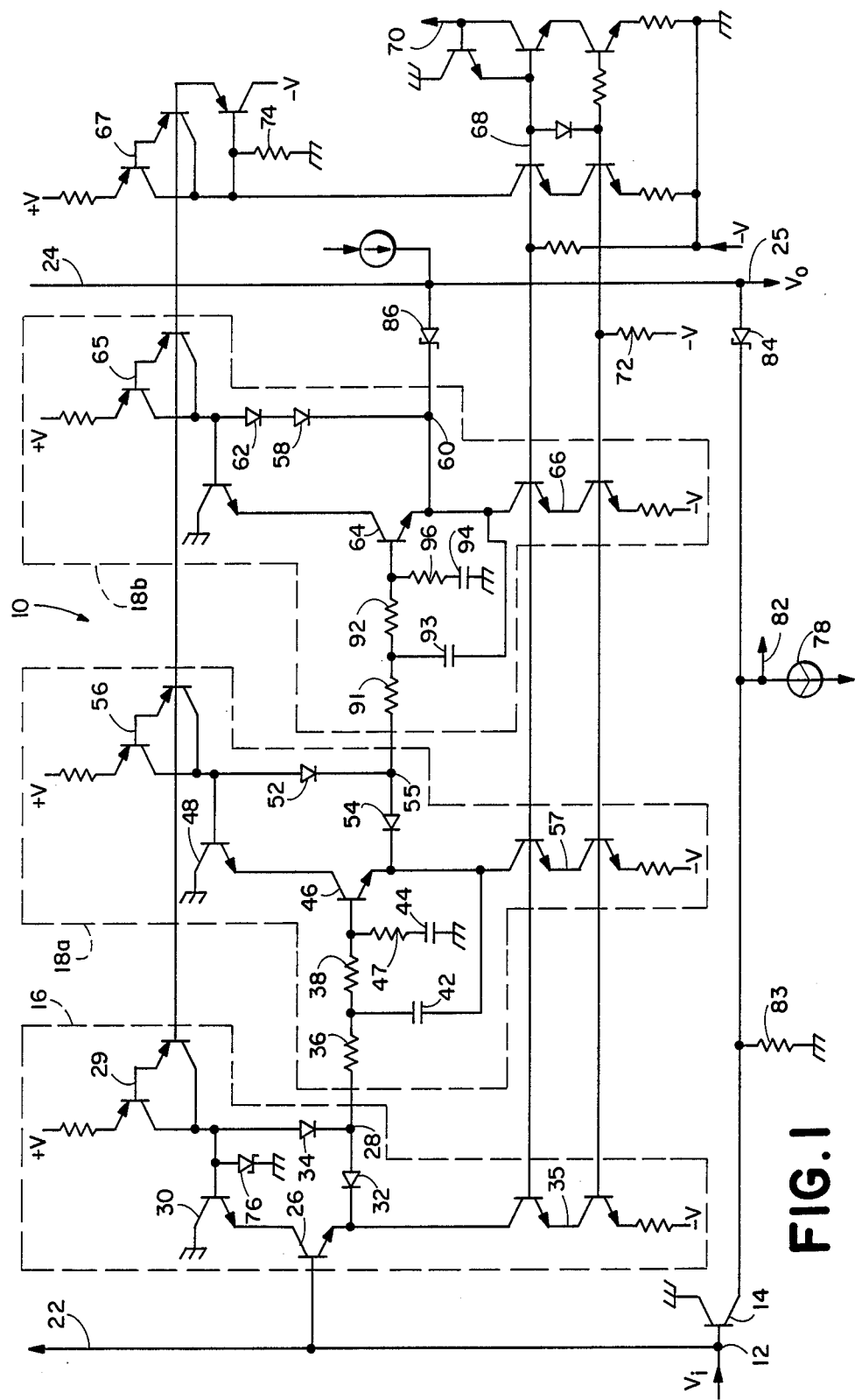
FIG. I

ACTIVE FILTER WITH BOOTSTRAPPING

FIELD OF THE INVENTION

This invention relates to active filters. More particularly, this invention relates to implementing an active filter in integrated circuit form with a bandwidth up to but not limited by $f_T/\beta B$ of the transistors within the filter. The $f_T/\beta B$ (transition frequency divided by beta) is a figure of merit for transistors.

BACKGROUND OF THE INVENTION

Filters are often called for in circuits that are to be implemented in integrated circuit (IC) form. In some cases, it has been necessary to implement such circuits with discrete inductors and capacitors located off the integrated circuit. This arrangement requires expensive hybrid circuit techniques and often additional interfacing circuits on the integrated circuit itself. For active filters that include an operational amplifier located either on the IC or external to it, a further drawback is the limited bandwidth of the operational amplifier.

In some circuits, a number of filters may be included that are selectively switched into the signal path upon command. An additional problem with switchable filters has been the difference in their low-frequency gain. As one filter replaces another in the signal path, the change in gain can change the output signal amplitude within the pass band.

SUMMARY OF THE INVENTION

An object of the invention, therefore, is to implement an active filter in integrated circuit form with a bandwidth up to an appreciable fraction of the transition frequency of active elements therein Another object of the invention is to provide a simple design for such filters.

Still another object of the invention is to provide a number of such filters to be selectively switched into the signal path, each filter having the same low-frequency gain.

Yet another object of the invention is to provide such filters with unity voltage gain.

To achieve these objects, an active filter according to the invention comprises filter means for filtering an input signal to pass the signal in a predetermined bandwidth and follower means for isolating the passed signal and feeding the passed signal back to the filter means. The passed signal introduces phase shift into the input signal to position the poles of the filter in the desired location. A bootstrap means is coupled to the follower means for isolating the passed signal and feeding it back to the follower means to reduce the capacitive effect of the follower means on the passed signal.

In one embodiment of the invention, the filter means comprises a low-pass resistor-capacitive arrangement, with the follower means comprising an emitter follower.

An active filter system may be constructed by connecting a plurality of active filters according to the invention across the signal path and then selectively switching a filter into the signal path. The active filters are designed to provide the same gain so that switching a filter into the signal path does not introduce a gain change within the pass band of the output signal.

The foregoing and other objects, features, and advantages of the invention will become more apparent from the following detailed description of a preferred embodiment which proceeds with reference to the accompanying drawings.

BRIEF DESCRIPTION OF THE DRAWING

FIG. 1 is a schematic diagram of a circuit embodying an active filter according to the invention.

DETAILED DESCRIPTION

The single figure shows an active filter system 10 that embodies an active filter according to the invention. Referring to the left side of the figure, an input voltage signal $V_i$ is received at an input terminal 12 of the system 10. Coupled to the input terminal 12 are a number of active filters, including an all-pass filter amplifier comprising an emitter follower 14 and a multipole low-pass filter comprising a unity gain buffer 16 in series with filter stages 18a and 18b. Other filters may be coupled to the signal path as indicated by the continuation of path 22 which transmits the input signal $V_i$ and path 24 which transmits the output signal $V_o$ from the selected filter to an output terminal 25. As will be explained, only one filter is switched into the signal path at a time so that $V_i$ is passed through a selected filter to produce $V_o$.

Considering the multipole low-pass filter in more detail, its first stage comprises the unity gain buffer 16 that receives the input signal at the base of an emitter follower 26 and reproduces $V_i$ with unity voltage gain at the buffer's output node 28. The buffer 16 serves primarily to prevent loading of $V_i$ by the impedance of the following filter stages 18a and 18b. Unity gain is assured by a bootstrap circuit including transistor 30, diode 32, and diode 34. Transistor 30 applies the input signal to the collector of emitter follower 26 to improve the gain of the emitter follower. The first diode 32 raises the bias level of the input voltage signal to minimize the voltage drop from input to output of the filter stage. The second diode 34 shifts the DC bias level of the voltage signal upward to bias transistor 30. Current for the buffer 16 is provided by an upper current source 29 and a lower current source 35. Current source 29 biases diodes 32 and 34 and transistor 30. Current source 35 completes the flow of current through the buffer 16.

The voltage signal at node 28 is passed to the filter stage 18a for filtering. Filter 18a comprises a filter means such as the resistor-capacitor arrangement of resistors 36, 38 and capacitors 42, 44. An emitter follower 46 has its base coupled to the resistor-capacitor arrangement for receiving the passed input signal and feeding the passed signal back to capacitor 42. The passed signal introduces phase shift into the input signal. The resistor-capacitor arrangement may also include a resistor 47 in series with capacitor 44 to cancel phase lag introduced into the passed signal by imperfections in the emitter follower 46.

The emitter follower 46 also, however, introduces a collector-base junction capacitance into the circuit that varies with the amplitude of $V_i$. To reduce the effect of this capacitance and increase the bandwidth of the filter stage 18a, a means for bootstrapping the passed input signal is provided. In this embodiment, the bootstrap circuit includes a transistor 48 that has its base coupled to the emitter of the emitter follower 46 through a pair of diodes 52 and 54. The emitter of transistor 48 is coupled to the collector of emitter follower 46 to transmit the passed input signal to the collector. The signal on the collector of transistor 46 is thus put in phase with the signal in the base to reduce the capacitance of the collector-base junction. As in the unity gain buffer 16, unity voltage gain is provided by transistor 48 and follower 46 to the voltage signal at the output node 55 of filter stage 18a. Diode 54, like diode 32, shifts the bias voltage upward to minimize the voltage shift from the input to the output of the filter stage. Diode 52, like diode 34, level shifts the DC bias voltage of the voltage signal upward to bias the bootstrapping transistor 48. Similar to the current sources of buffer 16, current for filter stage 18a is provided by an upper current source 56 and a lower current source 57.

The voltage signal at node 55 is transmitted through a second filter stage 18b of similar design to filter 18a. Resistors 91, 92, and 95 and capacitors 93 and 94 may be different from resistors 36 and 38 and capacitors 42 and 44 to tailor the filter's frequency response in accordance with standard filter practice. A significant difference is the location of diode 58. Unlike the location of diode 54 in filter 18a, diode 58 is coupled between the output node 60 of the filter and the second diode 62. This position of the diode reduces the output bias voltage of the multipole low-pass filter to match that of emitter follower 14. The overall gain of the multipole filter then matches the low-frequency gain of the all-pass amplifier comprising emitter follower 14. The emitter follower 64 also presents a lower impedance to output path 24 to minimize loading of the multipole filter by the path. Like filter stage 18a, filter stage 18b has an upper current source 65 and a lower current source 66.

The current sources of the multipole low-pass filter are driven by current source drivers 67 and 68. Driver 67 provides base current to the upper current sources 29, 56, and 65 of the unity gain buffer 16 and the filters 18a and 18b, respectively. Driver 68 provides base current to the respective lower current sources 35, 57, and 66. Current driver 68 is selectively enabled at a signal input 70 that receives a digital switching signal for selecting the multipole filter. When the switching signal is a logic High, an accurate DC current flows into input 70 to enable the current driver and select the filter. Current driver 68 in turn controls current driver 67. When current driver 68 is disabled, the lower current sources 35, 57, and 66 are disabled and the multipole filter is switched off. Pull down resistor 72 ensures that the base-emitter junctions of the lower current source transistors are not forward biased when the multipole filter is not selected. Current driver 67, however, does not completely turn off because of current leakage through resistor 74. This current sets up a base current in the driver 67 which is transmitted to the upper current sources 29, 56, and 65. Current from upper current source 29 flows through a diode 76 that clamps the voltage on collector emitter follower 26 to a fixed voltage above ground. This voltage back biases the collector-base junction of emitter follower 26 so that emitter follower 26 does not load input path 22.

The all-pass amplifier comprising emitter follower 14 passes approximately the full bandwidth of the input signal to the output terminal 25 of the filter system 10. The emitter follower 14 is selected by enabling a current source 78 to bias the emitter follower. Current source 78 is selectively enabled at a signal input 82 that receives a digital switching signal for selecting the all-pass amplifier. When the switching signal is a logic High, the current source 78 is enabled. The all-pass amplifier also includes a pull up resistor 83 for pulling up the voltage on the emitter of emitter follower 14 and reverse biasing its base-emitter junction when the emitter follower is not selected.

In operation of the device, one of the filters of the filter system 10 is selected to filter the input voltage signal from the input terminal 12 to the output terminal 25. Because of the voltage of the input signal and the biasing of the emitter follower, the output voltage signal of the selected filter will be negative with respect to the voltage on path 24. If the multipole filter is not selected, its output voltage will be positive with respect to path 24, set by current source 56 and emitter follower 48 in filter stage 18a and current source 65 and emitter follower 64 in filter stage 18b. For the all-pass amplifier comprising emitter follower 14, the output voltage of the amplifier will be at ground, still positive with respect to voltage on path 24. To isolate the filters that are not selected, switching diode 84 is coupled to the all-pass amplifier and switching diode 86 is coupled to the multipole low-pass filter. These diodes are biased by a current source 88. With a filter selected, the voltage on the cathode of a switching diode drops, causing the current source 88 to forward bias the respective diode and allow a voltage signal to pass through the diode to path 24. If a filter is not selected, the voltage on the diode cathode rises above the voltage on output path 24. This higher voltage shuts off the switching diode and thereby the filter.

Having illustrated and described the principles of the invention in a preferred embodiment, it should be apparent to those skilled in the art that the invention can be modified in arrangement and detail without departing from such principles. For example, each filter stage can be a separate filter. I claim all modifications coming within the spirit and scope of the following claims.

I claim:

1. An active filter comprising:
   filter means for filtering an input signal to pass the signal in a predetermined bandwidth;
   follower means coupled to the filter means for isolating the passed signal and feeding the passed signal back to the filter means to introduce phase shift into the input signal; and
   bootstrap means coupled to the follower means for isolating the passed signal and feeding the passed signal back to the follower means to reduce capacitive effects of the follower means on the passed signal.

2. The active filter of claim 1 in which the filter means comprises a low-pass filter arrangement.

3. The circuit of claim 1 in which the follower means comprises an emitter follower.

4. The circuit of claim 3 in which the bootstrap means comprises a transistor, the base of the transistor coupled to the emitter of the emitter follower and the emitter of a transistor coupled to the collector of the emitter follower.

5. An active filter comprising:
   a resistor-capacitor arrangement for filtering an input signal to pass the input signal in a predetermined bandwidth;
   an emitter follower, the base of the emitter follower coupled to the resistor-capacitor arrangement for receiving the passed input signal and the emitter of the emitter follower coupled to the resistor-capacitor arrangement for feeding the passed input signal back to the resistor-capacitor arrangement to introduce a phase shift into the input signal; and a bootstrap circuit including a transistor, the base of the transistor coupled to the emitter of the emitter follower for receiving the passed input signal and the emitter of the transistor coupled to the collector of the emitter follower for feeding the passed signal back to the emitter follower to reduce capacitive effects of the emitter follower on the passed signal.

6. The active filter of claim 5 in which the resistor-capacitor arrangement comprises a low-pass filter arrangement and the emitter of the emitter follower is coupled to a first capacitor of the arrangement.

7. The active filter of claim 6 in which a resistor is coupled in series with a second capacitor of the resistor-capacitor arrangement to cancel phase lag introduced into the passed signal by the emitter follower.

8. An active filter system having a signal path, comprising:

a plurality of active filters coupled across the signal path, each filter including a filter means for filtering the input signal to pass the input signal in a predetermined bandwidth, a follower means for feeding the passed signal back to the filter means, and a bootstrap means for feeding the passed signal back to the follower means;

current means for operating each of the active filters independently; and switching means for selectively enabling the current means to switch a selected active filter into the signal path while disabling the other active filters.

9. The active filter system of claim 8 in which an active filter may comprise a plurality of active filters coupled together to provide an active filter of a predetermined bandwidth.

10. The active filter system of claim 8 in which each of the active filters has the same low-frequency gain.

* * * * *